US011800685B2

(12) United States Patent
Diep et al.

(10) Patent No.: US 11,800,685 B2
(45) Date of Patent: *Oct. 24, 2023

(54) RAISED PATHWAY HEAT SINK

(71) Applicant: ARRIS Enterprises LLC, Suwanee, GA (US)

(72) Inventors: Justin Diep, San Diego, CA (US); Chien-Cheng Huang, Poway, CA (US); John Hausman, San Diego, CA (US); Hai Lin, San Diego, CA (US)

(73) Assignee: ARRIS Enterprises LLC, Suwanee, GA (US)

( * ) Notice: Subject to any disclaimer, the term of this patent is extended or adjusted under 35 U.S.C. 154(b) by 23 days.

This patent is subject to a terminal disclaimer.

(21) Appl. No.: 17/400,309

(22) Filed: Aug. 12, 2021

(65) Prior Publication Data

US 2021/0378134 A1 Dec. 2, 2021

Related U.S. Application Data

(63) Continuation of application No. 16/506,938, filed on Jul. 9, 2019, now Pat. No. 11,122,707.

(Continued)

(51) Int. Cl.
*H05K 7/20* (2006.01)
*H05K 1/02* (2006.01)
(Continued)

(52) U.S. Cl.
CPC ......... *H05K 7/2039* (2013.01); *H05K 1/0203* (2013.01); *H05K 1/181* (2013.01);
(Continued)

(58) Field of Classification Search
CPC .... H05K 5/0247; H05K 9/0022; H05K 9/006; H05K 1/0203; H05K 1/181;
(Continued)

(56) References Cited

U.S. PATENT DOCUMENTS 7,165,602 B2    1/2007  Wang
8,192,209 B1 *  6/2012  Li ................ H01R 13/6591
                                              174/40 R
(Continued)

FOREIGN PATENT DOCUMENTS

EP        2744312 A1     6/2014
WO     2014021046 A1     2/2014
WO     2014045671 A1     3/2014

OTHER PUBLICATIONS

Office Action dated Jul. 9, 2022 in Mexican Application No. MX/a/2019/008313.

(Continued)

*Primary Examiner* — Robert J Hoffberg
(74) *Attorney, Agent, or Firm* — Panitch Schwarze Belisario & Nadel LLC

(57) ABSTRACT

Wireless electronic devices include one or more wireless antennas to provide for wireless communications. The antenna cables are routed internally within the device and typically noise from components located on a circuit board may couple to the antenna cables and cause a degradation in wireless performance, impact antenna sensitivity and cause packet loss. Utilizing raised pathways in a heat sink utilized for thermal transfer of heat to a housing enables tunnels to be formed between the housing and the heat sink. Routing the antenna cables through the tunnels improves noise isolation for the antenna cables while still maintaining the heat transfer. The raised pathways are configured to not interfere with components on the circuit board or components included in the housing. The wireless antennas may be mounted within the housing instead of on the board so no portion of the antenna cables are located on the circuit board.

19 Claims, 8 Drawing Sheets

Related U.S. Application Data

(60) Provisional application No. 62/696,884, filed on Jul. 12, 2018.

(51) Int. Cl.
*H05K 9/00* (2006.01)
*H05K 1/18* (2006.01)
*H05K 7/14* (2006.01)
*H01Q 1/12* (2006.01)

(52) U.S. Cl.
CPC ........... *H05K 7/1427* (2013.01); *H05K 9/006* (2013.01); *H05K 9/0022* (2013.01); *H01Q 1/12* (2013.01); *H05K 2201/066* (2013.01)

(58) Field of Classification Search
CPC ............. H05K 7/2039; H05K 7/20445; H05K 7/1427; H05K 2201/066; H04B 1/08; H01Q 1/12
See application file for complete search history.

(56) References Cited

U.S. PATENT DOCUMENTS

| | | | |
|---|---|---|---|
| 8,193,450 B1 * | 6/2012 | Kam | H02G 3/0456 174/16.3 |
| 8,681,501 B2 | 3/2014 | Govindasamy et al. | |
| 8,687,353 B2 | 4/2014 | Murakata | |
| 9,854,678 B2 | 12/2017 | Song et al. | |
| 2014/0321604 A1 | 10/2014 | Bourland et al. | |
| 2016/0255300 A1 | 9/2016 | Ritter et al. | |
| 2016/0295738 A1 | 10/2016 | Ritter et al. | |

OTHER PUBLICATIONS

Extended European Search Report, RE: Application No. EP 19185611.1, dated Apr. 3, 2020.

* cited by examiner

RAISED PATHWAY HEAT SINK

CROSS-REFERENCE TO RELATED APPLICATIONS

This application claims the benefit of U.S. Non-Provisional patent application Ser. No. 16/506,938, filed on Jul. 9, 2019, which claims the benefit of U.S. Provisional Application No. 62/696,884, filed on Jul. 12, 2018, the disclosures of which are hereby incorporated by reference in its entirety.

BACKGROUND

Electronic devices typically contain a plurality of components (e.g., integrated circuits, connectors, wires, resisters, capacitors) mounted to one or more circuit boards. Some of the components (e.g., ICs, connectors) may release electromagnetic interference (EMI), also referred to as radio-frequency interference (RFI). The EMI may affect other components on the circuit board and may cause problems with the operation of the electronic device. Some components may be sensitive to the EMI. To limit EMI, the circuit board may include gaskets and/or shielding. For example, a gasket may be utilized around a connector to limit the EMI that exits the connector or is received by the connector. Shielding may be placed around ICs that produce EMI and/or ICs that are sensitive to EMI. Accordingly, the EMI generating components may be surrounded with a shielding that limits the EMI that is emitted therefrom. Alternatively, the components that are sensitive to the EMI may be surrounded with a shielding that limits the EMI that is received thereby. The shielding may include walls that are mounted to the circuit board around the component(s) and then a cover that is mounted to the walls that encases the component(s).

Certain areas of the circuit board may be considered noisy based on the design thereof (e.g., components utilized in the circuit board) and certain components mounted on the circuit board may be noisy components. Noise may be defined as disturbances in useful signals associated therewith. Noisy components may include, for example, memory ICs such as dynamic random-access memory (DRAM) or double data rate (DDR) synchronous DRAM, high-definition multimedia interface (HDMI) components and universal serial bus (USB) components.

Wireless electronic devices include one or more wireless antennas to provide for wireless communications. The wireless antennas (ICs) may be mounted to different areas of the circuit board with antenna cables extending therefrom that are routed on the circuit board. The noise from the noisy components may couple to the antenna cables and cause a degradation in wireless performance. The added noise may impact antenna sensitivity and cause packet loss. In order to limit the impact of noise, the antenna cables may be routed across paths on the circuit board that are determined, for example empirically, to be less noisy than alternative paths on the circuit board. Determining the less noisy pathways that limit the impact on the wireless device may be difficult and may not provide the most efficient mounting for the wireless antennas or routing of the cables.

FIG. 1 illustrates a high level layout of an example circuit board 100 providing wireless connectivity. The example circuit board 100 includes a first connector 110 and a second connector 120 for receiving external cables (e.g., Ethernet, coaxial, HDMI, USB), a first IC 130 and a second IC 140 for performing various functions (e.g., processors, memory), and a first antenna 150, a second antenna 160 and a third antenna 170 for providing wireless communications. The first, second and third antennas 150, 160, 170 include antenna cables 155, 165, 175 respectively. The circuit board 100 may include pathways 105 thereon that connect the various components. As illustrated, the pathways 105 connect the first and second connectors 110, 120 and the first, second and third antennas 150, 160, 170 to the first IC 130, and the first IC 130 to the second IC 140. It should be noted that for simplicity only a single pathway 105 is illustrated for each connection but is in no way limited thereto. Furthermore, while all the pathways are identified the same (as 105) they may be different types of pathways.

The first connector 110 may allow EMI to pass therethrough and therefore may include a gasket 115 surrounding the connector 110. The first IC 130 may emit EMI and may therefore include a shielding 135 secured to the circuit board 100 around the IC 130 that also covers the IC 130. The second connector 120 and the second IC 140 may be noisy components with the noisiest areas 125, 145 annotated. The first, second and third antennas 150, 160, 170 are mounted to different locations on the circuit board 100 (three corners as illustrated) and the antenna cables 155, 165, 175 may be routed on the circuit board 100 around the various components 110, 115, 120, 130, 135, 140 included thereon and the noisy areas 125, 145 thereof.

The circuit boards (and the components mounted thereto) and other components may typically be mounted within a housing. The housing may hold the various components and protect them from external factors. The housing may also enable one or more connectors and/or receptacles located therein, that may be mounted to the circuit board, to be accessed externally. The connectors and/or receptacles may enable connecting to one or more external sources via different cables and the connections may provide, for example, power and/or communications.

Electronic and/or mechanical components within an electronic device tend to generate a substantial amount of heat. Accordingly, thermal management of electronic devices is required. A heat sink is a passive heat exchanger that transfers the heat generated by the electronic/mechanical device to a fluid medium, often air, where it is dissipated away from the device, thereby allowing regulation of the device's temperature at optimal levels. A heat sink is designed to maximize its surface area in contact with the cooling medium surrounding it, such as the air. Air velocity, choice of material, protrusion design and surface treatment are factors that affect the performance of a heat sink. Heat sink attachment methods and thermal interface materials also affect the die temperature of the integrated circuit. Thermal adhesive or thermal grease improve the heat sink's performance by filling air gaps between the heat sink and the device. A heat sink is usually made out of copper or aluminum. Copper is used because it has many desirable properties for thermally efficient and durable heat exchangers. First and foremost, copper is an excellent conductor of heat. This means that copper's high thermal conductivity allows heat to pass through it quickly. Aluminum heat sinks are used as a low-cost, lightweight alternative to copper heat sinks, and have a lower thermal conductivity than copper.

As electronic devices are getting smaller, the real estate available for heat dissipation is also getting smaller. Heat sinks that extend substantially along the footprint of the electronic device and may be secured to and/or be flush against, for example, an upper and/or lower portion of the casing of the electronic device may be utilized. The heat sinks may be in contact with a component generating heat, for example an electronic component mounted on the circuit board, and spread the heat from that component along the surface of the heat sink (e.g., across footprint of the electronic device).

FIG. 2 illustrates an exploded view of an example high level electronic device 200. The electronic device 200 includes an upper casing 210, a lower casing 220, a circuit board 230, an upper heat sink 240 and a lower heat sink 250. The upper and lower casings 210, 220 may be secured together to form a housing of the device 200. While not indicated for ease of illustration, the upper and/or lower casings 210, 220 may include connectors, receptables, switches, indicators or the like.

For ease of illustration, the circuit board 230 simply illustrates a first component 260 on an upper side thereof and a second component 270 on a lower side thereof. The first component 260 may contact the upper heat sink 240 so that the heat sink 240 can spread the heat generated by the first component 260 across the top portion of the electronic device 200. For ease of illustration, the contact is not illustrated but the heat sink 240 may directly contact the first component 260 or thermal pads, or the like, may be utilized to make the contact. Furthermore, for ease of illustration the heat sink 240 is illustrated as being flat and shaped to match the shape of the upper casings 210 (e.g., square) but is not limited thereto. Rather, the surface configuration and shape of the heat sink 240 may be dictated by the configuration of the various components within the electronic device 200. To the extent possible, the heat sink 240 may lay flush against the upper casings 210 and may be secured thereto in some fashion (e.g., with screws).

The second component 270 may contact the lower heat sink 250 in order to spread the heat generated by the second component 270 across the lower portion of the electronic device 200. For ease of illustration, the contact is not illustrated and the heat sink 250 is illustrated as being flat and shaped to match the shape of the lower casings 220 (e.g., square) but is not limited thereto. To the extent possible, the heat sink 250 may lay flush against the lower casings 220 and may be secured thereto in some fashion (e.g., with screws).

SUMMARY

A heat sink apparatus comprising a main surface configured to be in close proximity to an inner surface of an enclosure. One or more raised pathways are formed in the main surface. The one or more raised pathways form one or more tunnels between the heat sink apparatus and the inner surface of the enclosure.

A device comprising a housing and a heat sink. The heat sink has a main surface adapted to be secured in close proximity to an inner surface of at least one side of the housing. The main surface includes one or more raised pathways that form one or more tunnels between the heat sink and the inner surface of the at least one side of the housing.

A wireless electronic device comprising a housing, a printed circuit board with a plurality of components mounted thereto including at least one integrated circuit, at least one wireless antenna, wherein the at least one wireless antenna includes at least one antenna cable, and a heat sink. The heat sink has a main surface adapted to be secured in close proximity to an inner surface of at least one side of the housing. The main surface includes one or more raised pathways that form one or more tunnels between the heat sink and the inner surface of the at least one side of the housing. The one or more tunnels are to route the at least one antenna cable.

BRIEF DESCRIPTION OF THE DRAWINGS

Various features of the embodiments described in the following detailed description can be more fully appreciated when considered with reference to the accompanying figures, wherein the same numbers refer to the same elements.

DETAILED DESCRIPTION

For simplicity and illustrative purposes, the principles of the embodiments are described by referring mainly to examples thereof. In the following description, numerous specific details are set forth in order to provide a thorough understanding of the embodiments. It will be apparent however, to one of ordinary skill in the art, that the embodiments may be practiced without limitation to these specific details. In some instances, well known methods and structures have not been described in detail so as not to unnecessarily obscure the embodiments.

The trend for electronic devices is to get smaller and provide additional capabilities, including wireless connectivity such as Wi-Fi (IEEE 802.11). Set top boxes (STBs) capable of providing high definition video via wireless connections are no exception. The STBs may include up to four wireless (e.g., Wi-Fi) antennas to provide sufficient wireless connectivity. The antennas may support different frequencies and have multiple frequency bands at which to communicate. The antennas may be located at different locations within the STB to provide the best coverage. The wireless antenna cables need to be routed within the STB. The routing of the antenna cables to have the least interference is a challenge.

Figure 1:
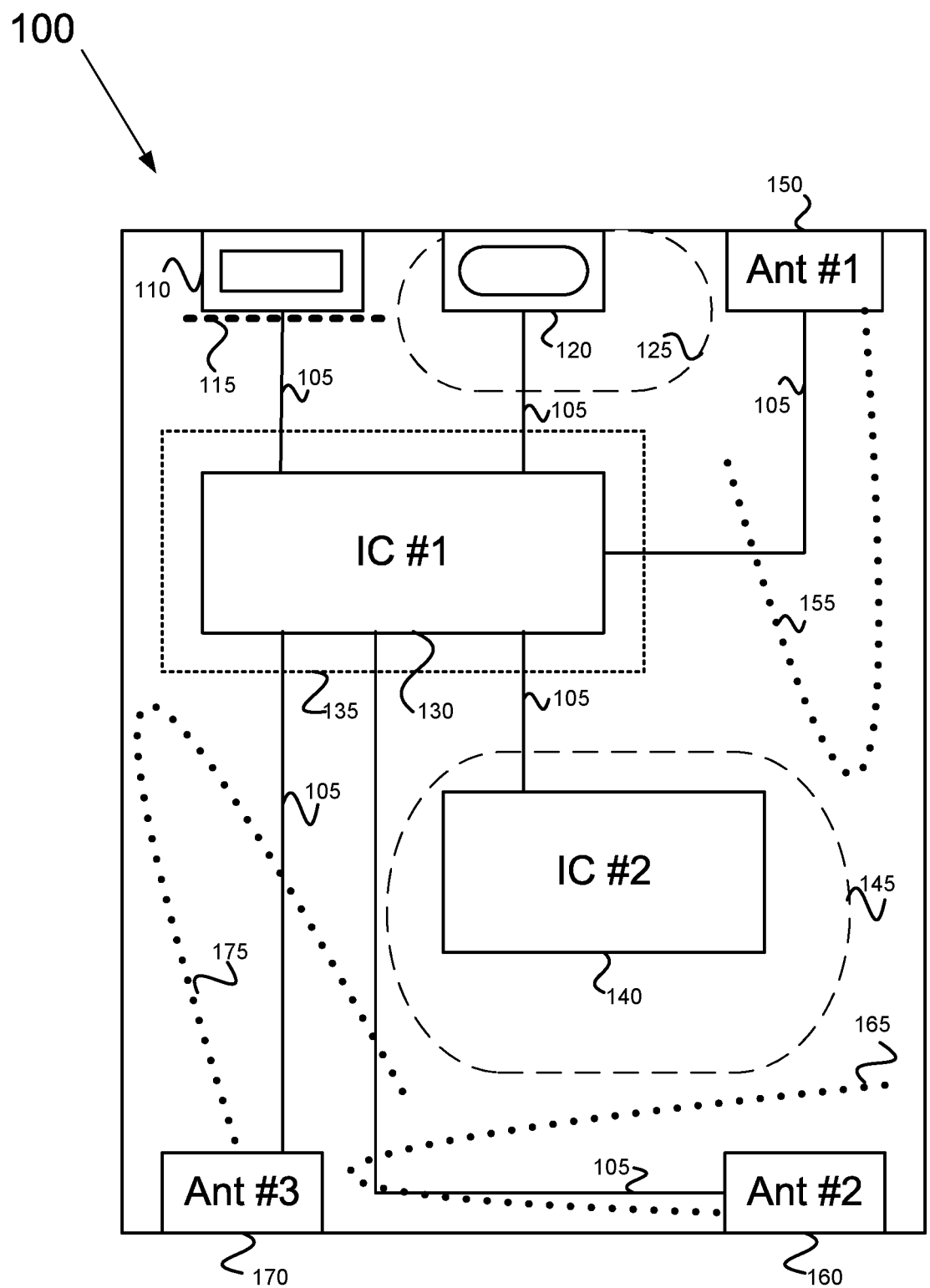
FIG. 1 illustrates a high level layout of an example circuit board providing wireless connectivity.
Figure 2:
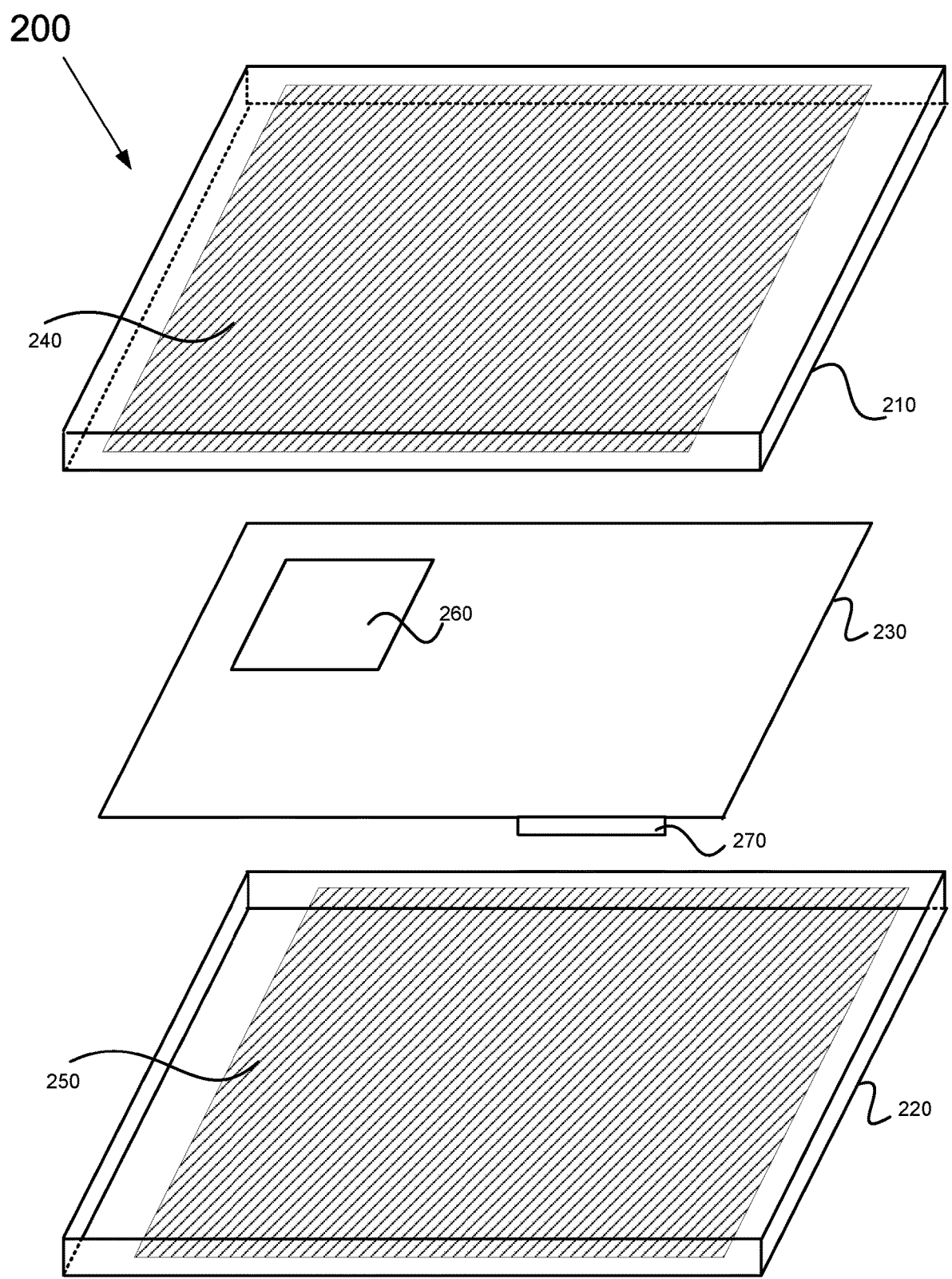
FIG. 2 illustrates an exploded view of an example high level electronic device.
Figure 3:
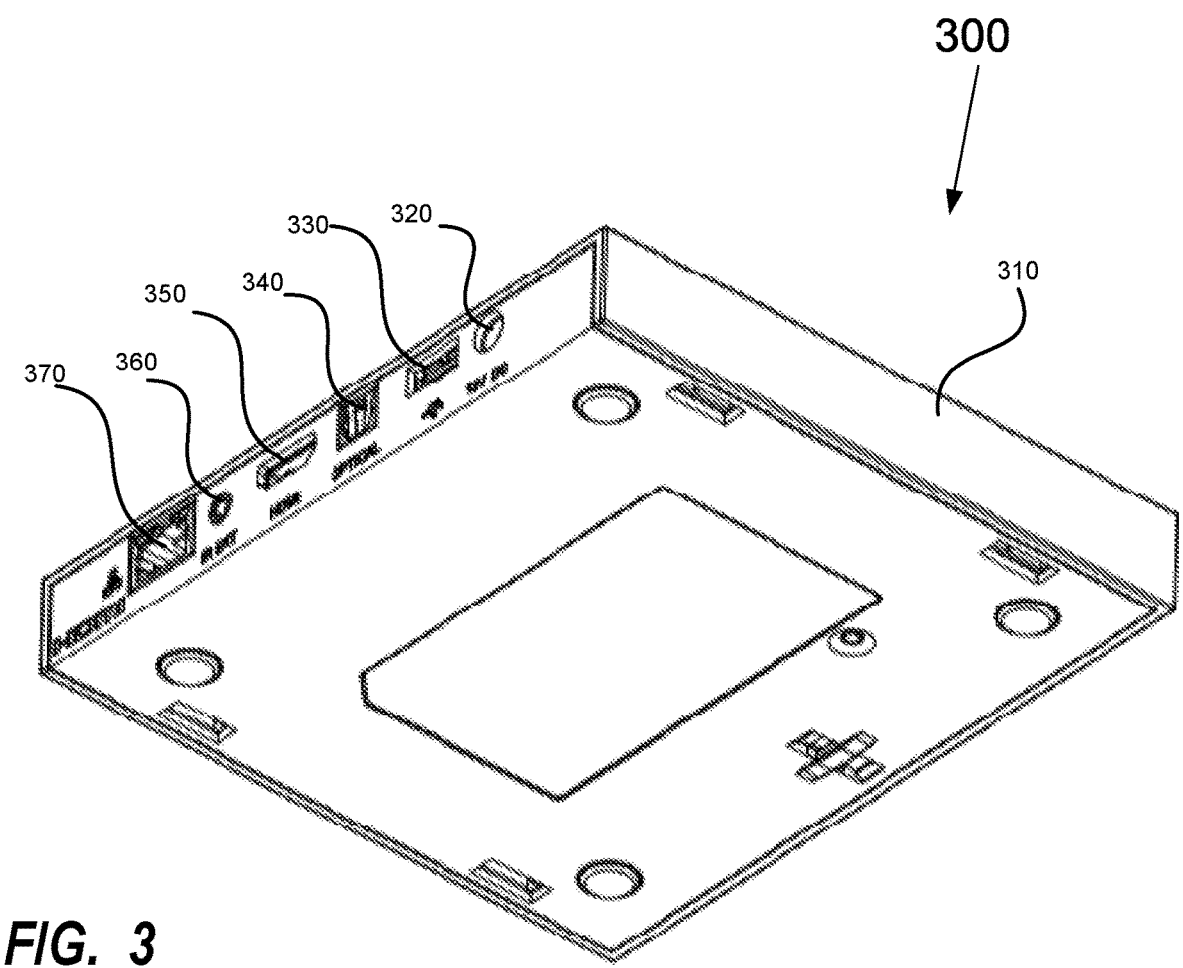
FIG. 3 illustrates a perspective bottom view of an example Internet Protocol (IP) set-top box (STB) capable of providing high definition video via wireless communications, according to one embodiment.

FIG. 3 illustrates a perspective bottom view of an example Internet Protocol (IP) STB 300 capable of providing high definition video via wireless communications. The STB 300 may include a housing 310 that holds the various components therewithin. The housing 310 may include a plurality of connectors in an exterior thereof to enable different cables to be received thereby. The cables received by the connectors may provide, for example, power to and/or communications with the STB 300. As illustrated, the STB 300 includes a power connector 320, a USB connector 330, an optical connector 340, an HDMI connector 350, an infrared (IR) extension connector 360 and an Ethernet connector 370.

As noted above, electronic devices (such as the STB 300) may include heat sinks that run along, for example, upper and lower surfaces thereof. The heat sinks may be flush against an interior of the upper and lower surfaces. In addition to dissipating heat, the heat sink may also filter (block, restrict) noise generated by the circuit board. According to one embodiment, the heat sink could be utilized to limit the impact of noise on the antenna cables if the heat sink was located between the circuit board and the antenna cables (the heat sink may isolate the antenna cables from noisy components on the circuit board). One way to accomplish this would be to run the antenna cables on a side of the heat sink opposite the circuit board. As the heat sinks may be designed to be flush against the housing (in contact therewith) or be in close contact thereto, running the antenna cables between the heat sink and the housing may create problems (e.g., not enable the heat sink to be flush with the housing).

According to one embodiment, the heat sink may be designed to include raised portions that would not be flush with the housing when the STB was assembled. These raised portions are arranged along one or more pathways that provide one or more tunnels between the heat sink and the housing for the antenna cables to be run. The raised portions should be located so as to not impact other components within the STB (e.g., connectors in the housing, components on the circuit board). The use of the raised pathways enable the antenna cables to be routed between the heat sink and the housing and thus reduce the impact of board noise on antenna cables and increase receiver performance. The use of the raised pathways on the heat sink improve noise isolation while maintaining good thermal transfer between the heat sink and the housing.

According to one embodiment, the wireless antennas may be mounted, for example, within the housing instead of on the board. This enables the antenna cables to easily enter the tunnels created therefore and also does not require any portion of the antenna cable to be located on the circuit board (further limit noise). The wireless antennas may connect to the circuit board utilizing radio frequency (RF) cables and RF connectors.

Figure 4:
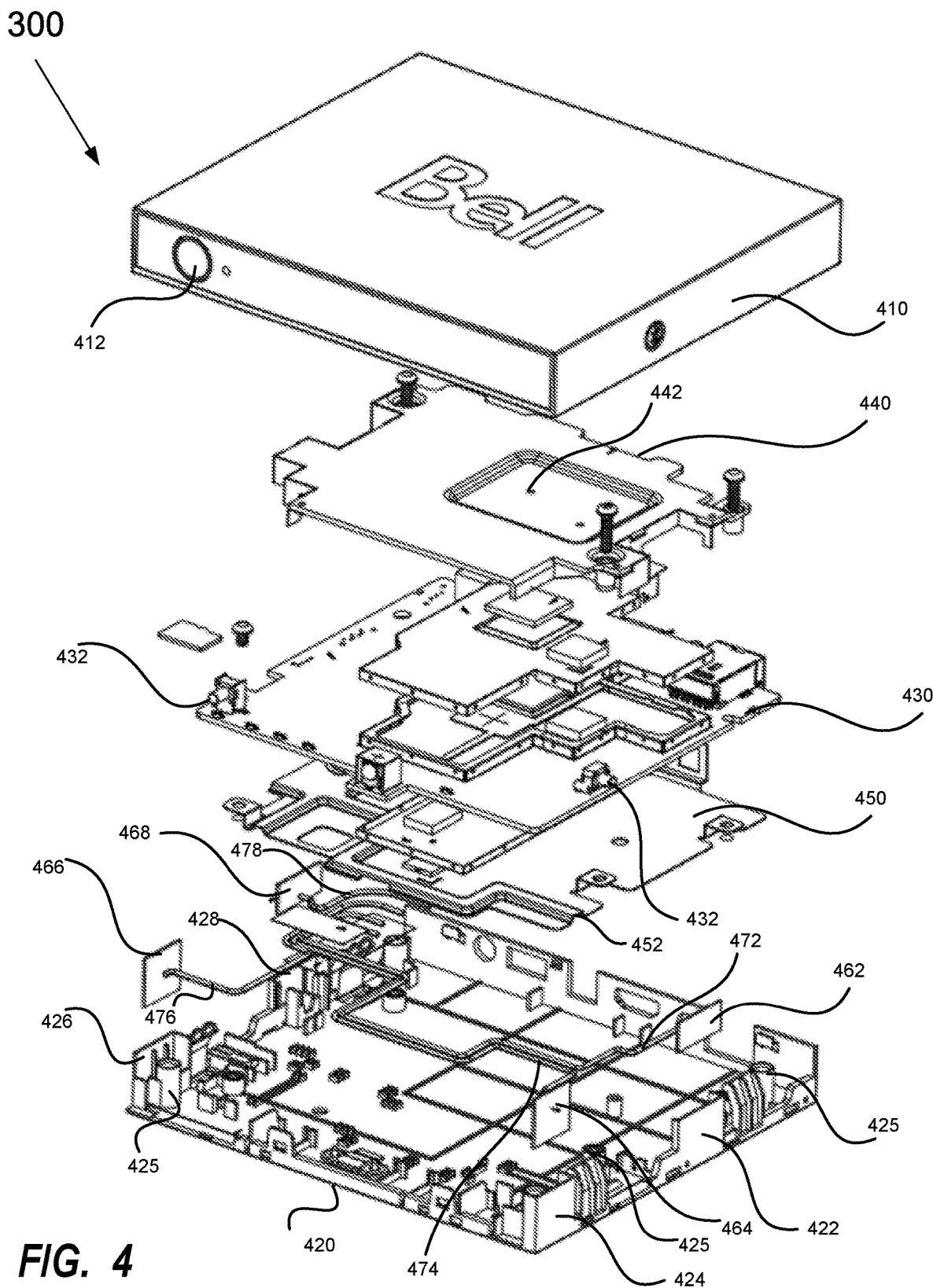
FIG. 4 illustrates an exploded view of an example IP STB, according to one embodiment.

FIG. 4 illustrates an exploded view of an example IP STB 300. The STB 300 may include an upper cover 410, a lower cover 420, a circuit board 430, an upper heat sink 440 and a lower heat sink 450. The upper cover 410 and the lower cover 420 when secured together may form the housing for the STB 300. The upper and lower covers 410, 420 may be secured together in various manners that are all within the scope of the current invention. According to one embodiment, the upper and lower covers 410, 420 may be formed entirely or partially of plastic. The upper and lower covers 410, 420 may be formed of other materials that provide the desired parameters (e.g., strength, weight).

The upper cover 410 may include, for example, a power button 412. The lower cover 420 may include openings (not labeled) in, for example, a back wall for enabling the various connectors (e.g., 320-370) to be accessed. The lower cover 420 may also include holders 422, 424, 426, 428 formed therein for holding wireless antennas 462, 464, 466, 468. The lower cover 420 may include a plurality (4 illustrated) of posts 425 for receiving screws therein. The posts 425 may be utilized to secure various components within the STB 300 to the lower cover 420. For example, the upper and lower heat sinks 440, 450 could be secured to the lower cover 420 by passing screws through holes in the heat sinks 440, 450 into the posts 425. The lower cover 420 may include some type of support (not annotated) for securing the antenna cables to desired location thereon (e.g., in alignment with raised pathways in heat sink). The supports may be, for example, clips, brackets, connectors or the like.

According to one embodiment, the upper and lower heat sinks 440, 450 may be formed of a metal such as aluminum. The upper and lower heat sinks 440, 450 may be made of other materials that provide the desired parameters (e.g., thermal conductivity, price, weight, fabrication). According to one embodiment, the upper and lower heat sinks 440, 450 may be relatively thin (e.g., 1.0 mm).

The lower heat sink 450 may include raised portions 452 forming one or more pathways. The raised pathways 452 may be aligned with the antenna cable supports in the lower cover 420. The raised pathways 452 may form one or more tunnels when the heat sink 450 is secured in place along the lower cover 420 (e.g., is flush to the lower cover 420). The tunnels formed are to route antenna cables 472, 474, 476, 478 therethrough. The raised pathways 452 are formed around the components located on the lower cover 420 as well as the components on the circuit board 430. The raised pathways 452 may have dimensions sufficient to receive one or more antenna cables therein.

The components on the circuit board 430 include, for example, integrated circuits (ICs), thermal pads, shielding and connectors. Examples of circuit boards that may be utilized in the STB 300 will be disclosed in more detail with respect to FIGS. 5A-B and 6A-B. The circuit board 430 may include RF connectors 432 (only two visible) for receiving RF cables (not illustrated) from the wireless antennas 462, 464, 466, 468 in order for the circuit board 430 to communicate therewith.

Figure 5A:
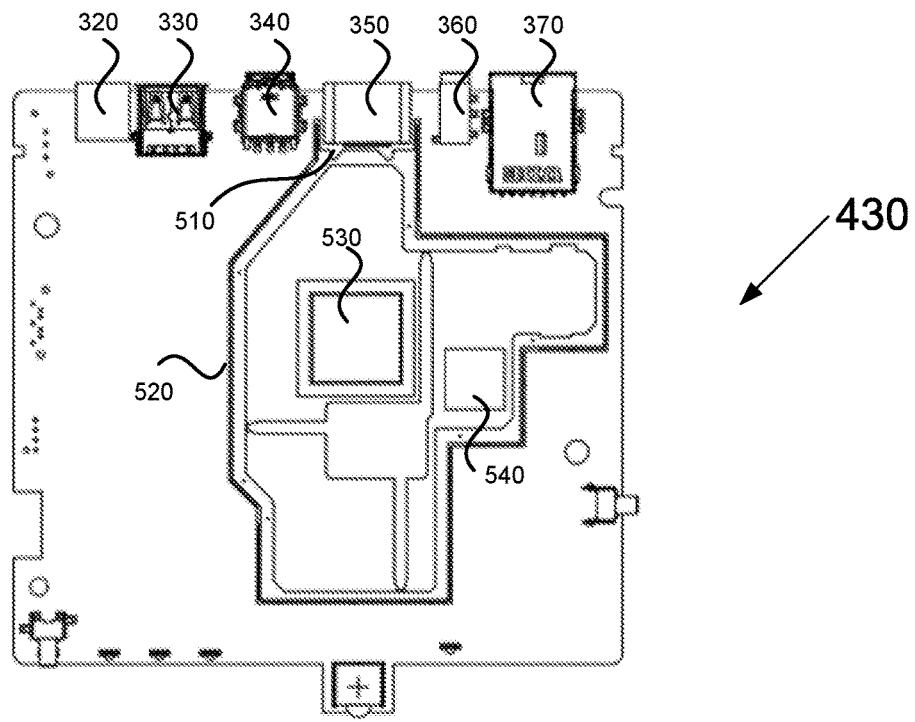
FIGS. 5A-B illustrate a top view of a first side (upper side) of an example circuit board in different states of assembly, according to one embodiment.
Figure 5B:
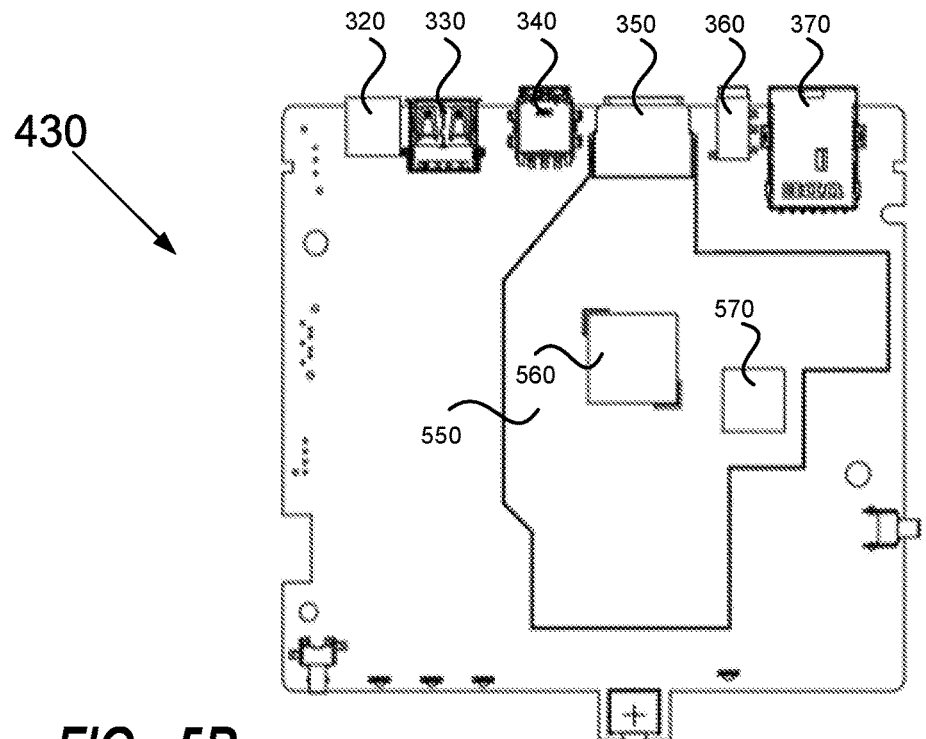

FIGS. 5A-B illustrate a top view of a first side (upper side) of an example circuit board 430 in different states of assembly. The circuit board 430 may include a plurality of connectors along, for example, a back edge thereof. The connectors may be, for example, a power connector 320, a USB connector 330, an optical connector 340, an HDMI connector 350, an IR extension connector 360 and an Ethernet connector 370. The circuit board 430 may include a plurality of components mounted to the upper side thereof including ICs (the individual components are not identified for ease of illustration).

FIG. 5A illustrates an initial application of shielding and heat disbursement thereto. A gasket 510 may be located around, for example, the HDMI connector 350. A shielding wall 520 may be secured to the upper side of the circuit board 430 around various components that require shielding. The components may include, for example, ICs and the ICs may include a processor and memory. A first thermal pad 530 may be placed on top of a first component generating heat (e.g., first IC) and a second thermal pad 540 may be placed on top of a second component generating heat (e.g., second IC).

FIG. 5B illustrates a secondary application of shielding and heat disbursement thereto. A shielding cover 550 may be placed on the shielding wall 520 in order to cover all the components located within the shielding wall 520. After the shielding cover 550 is secured on the shielding wall 520, a third thermal pad 560 may be placed on top of where the first IC is located and a fourth thermal pad 570 may be placed on top of where the second IC is located. The use of the thermal pads 530, 560 and 540, 570 (above and below the shielding cover 550) for the first and second ICs ensures that the heat from the ICs is provided to the upper heat sink 440.

Referring back to FIG. 4, the upper heat sink 440 may include a lowered portion 442 in alignment with the thermal pads 560, 570 to ensure connectivity thereto. The heat sink 440 may disperse the heat from the ICs upward and outward therefrom.

Figure 6A:
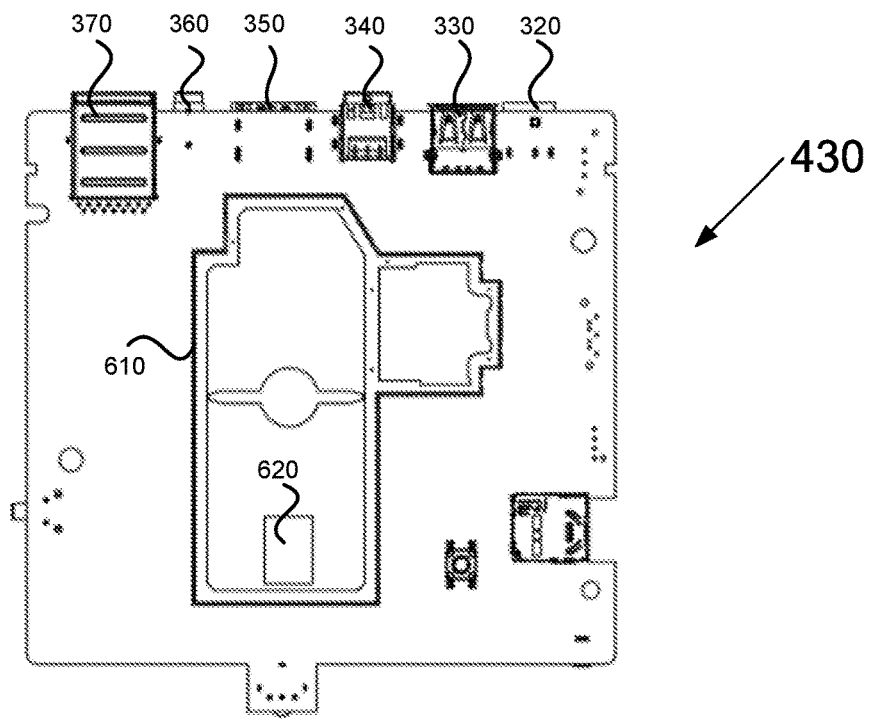
FIGS. 6A-B illustrate a top view of a second side (lower side) of an example circuit board in different states of assembly, according to one embodiment.
Figure 6B:
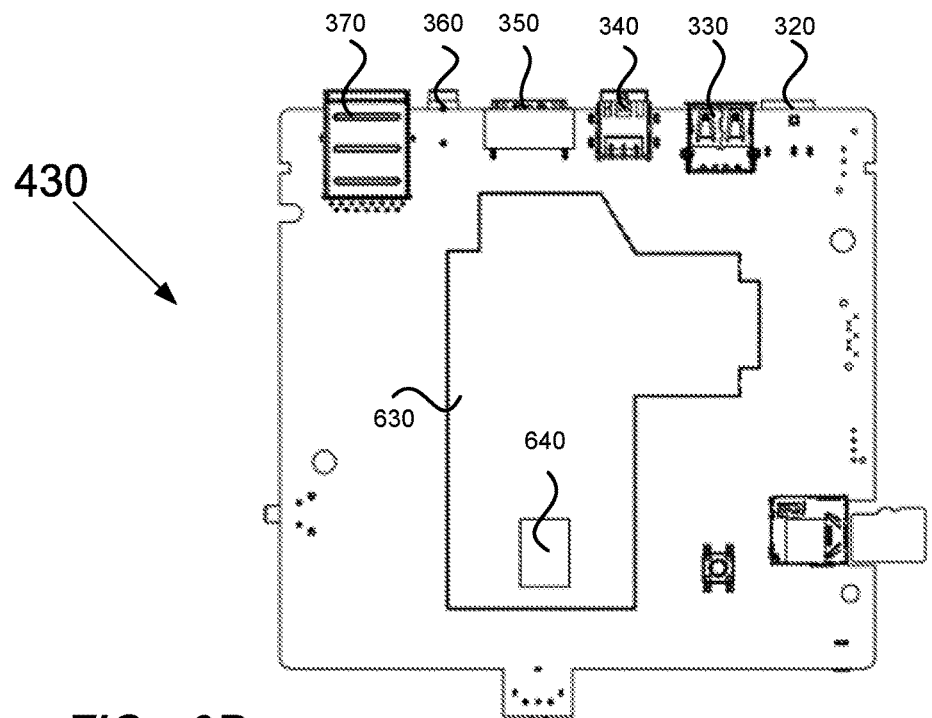

FIGS. 6A-B illustrate a top view of a second side (lower side) of an example circuit board 430 in different states of assembly. The circuit board 430 may include a plurality of components mounted to a lower side thereof including ICs (the individual components are not identified for ease of illustration). FIG. 6A illustrates an initial application of shielding and heat disbursement thereto. A shielding wall 610 may be secured to the circuit board 430 around various components that may require shielding (e.g., ICs). A first thermal pad 620 may be placed on top of a component generating heat (e.g., IC). FIG. 6B illustrates a secondary application of shielding and heat disbursement thereto. A shielding cover 630 may be placed on the shielding wall 610 in order to cover all the components located therewithin. After the shielding cover 630 is secured thereto, a second thermal pad 640 may be placed on top of where the IC is located. The use of the thermal pads 620, 640 (above and below the shielding cover 630) for the IC ensures that the heat from the IC is provided to the lower heat sink 450.

Figure 7A:
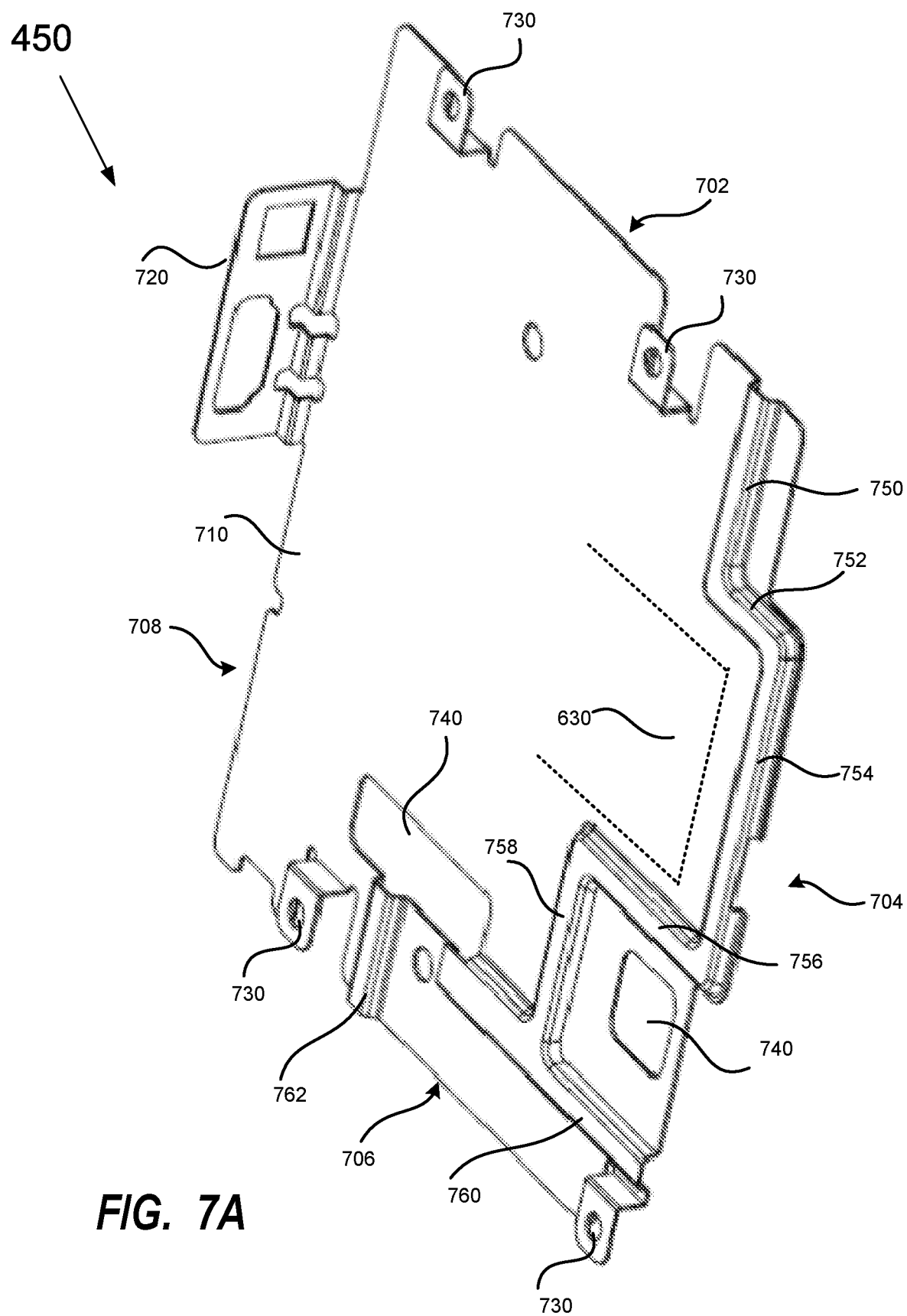
FIGS. 7A-C illustrate variations of example heat sinks having raised pathways formed therein.
Figure 7B:
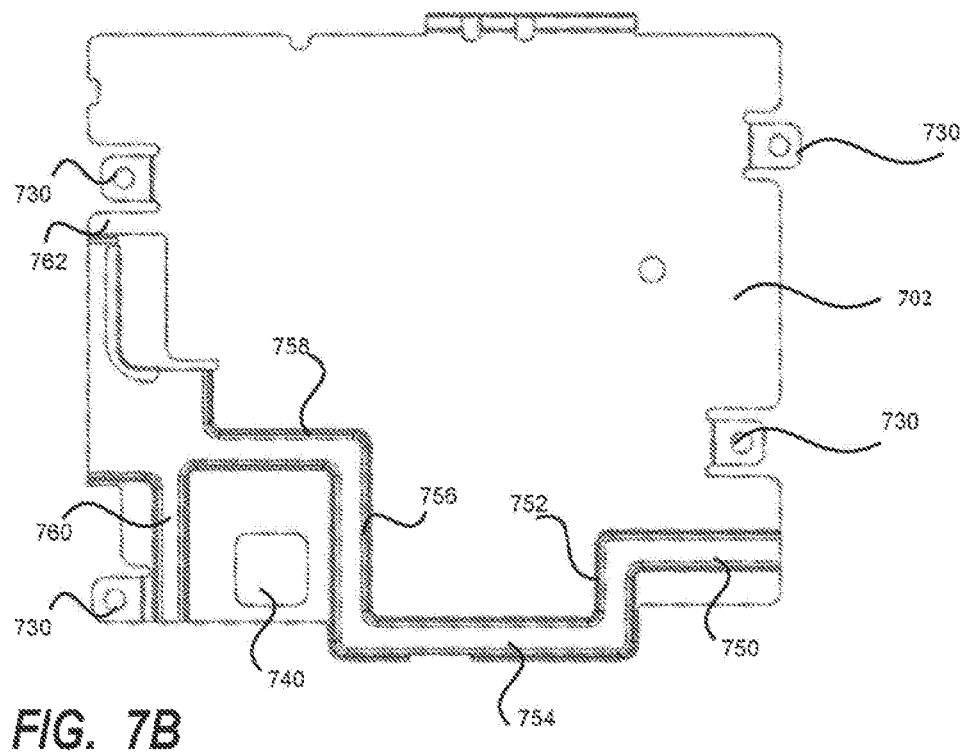
Figure 7C:
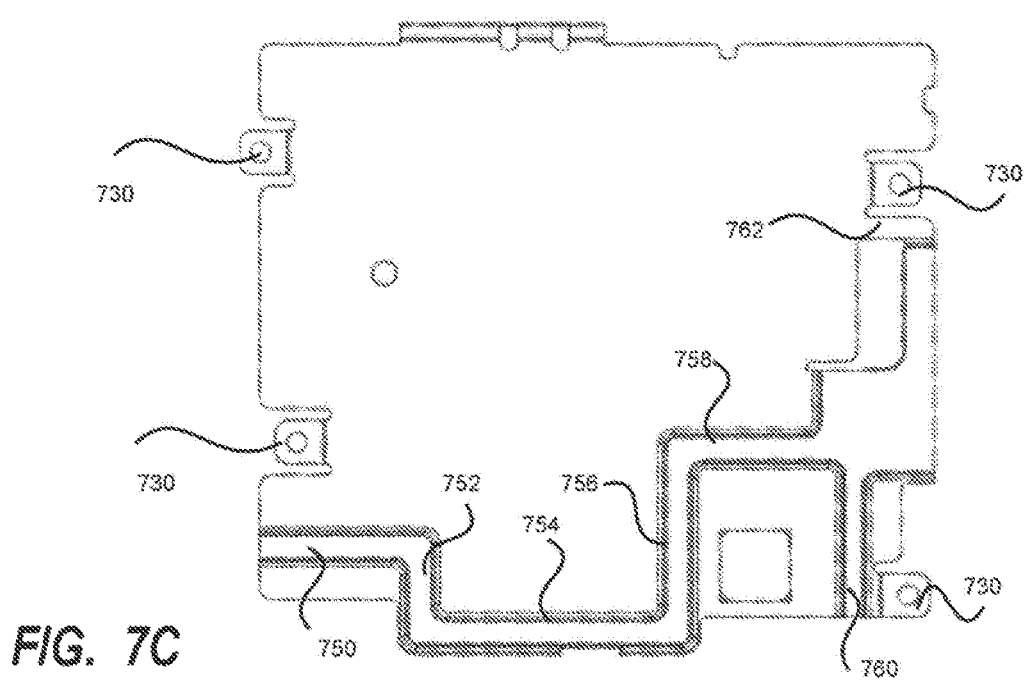

FIGS. 7A-C illustrate variations of example heat sinks 450, relative to each other, having raised pathways formed therein. The heat sink 450 includes a main surface 710 that may lay flush against an external housing (e.g., lower cover 420). The heat sink 450 may also include a side extension 720 in alignment with one or more connectors associated with the device (e.g., STB 300). The heat sink 450 may include a plurality (e.g., 4 illustrated) of connection means 730 for securing the heat sink 450 in place. As illustrated, the connection means 730 are raised tabs having holes therein for allowing screws to pass therethrough and be secured within, for example, receptacles. Referring back to FIG. 4, the receptacles may be the posts 425. The connection means 730 is not limited to raised tabs, tabs, or screw holes or any specific number of connection means 730. Rather, the connection means 730 could be any manner of securing the heat sink to the lower cover 420 or within the STB 300 without departing from the current scope.

The main surface 710 may include one or more holes 740 therein to, for example, allow components on a lower cover 420 to pass therethrough. The main surface 710 may also include one or more raised portions forming one or more pathways. The raised pathways may provide an area for which the antenna cables may be located between the heat sink 450 and the lower cover 420. As previously noted, the raised pathways and the antenna cable supports in the lower cover should be aligned with one another. The antenna cable supports hold the antenna cables in place and the raised pathways fit over the antenna cables.

As illustrated, the raised pathways may include a first portion 750 that starts along a first edge 702 and extends inward therefrom. The first portion 750 may receive the antenna cables from the first and second antennas 462, 464 housed on that edge 702. A second portion 752 may extend from the first portion 750 towards a second edge 704 thereof, a third portion 754 may extend along the second edge 704, and a fourth portion 756 may extend inward from the second edge 704 towards a fourth edge 708. The portions 752, 754, 756 may be configured to route the antenna cables around, for example, the shielding cover 630 (illustrated as a dashed line in FIG. 7A for context) located on the lower side of the circuit board 430. A fifth portion 758 may extend from the fourth portion 756 toward a third edge 706.

A sixth portion 760 may start along the second edge 704 and extend inward therefrom. The sixth portion 760 may receive the antenna cable from the third antenna 466 mounted along the third edge 706 in that corner. The sixth portion 760 may connect to the fifth portion 758. The section of the sixth portion 760 extending inward from the fifth portion 758 may be wider and/or deeper as it may be designed to route several antenna cables (e.g., cables from antennas 462, 464, 466). A seventh portion 762 may start along the third edge 706 and extend inward therefrom. The seventh portion 762 may receive the antenna cable from the fourth antenna 468 mounted along that edge 706.

The raised pathways are in no way intended to be limited to the illustrated embodiments. Rather, the illustrated embodiments are simply to show how the pathways may be aligned with placement of the antennas 462, 464, 466, 468 and route around components on the circuit board 430 and cover 420.

FIGS. 4 and 7A-C illustrate and disclose the lower cover 420 having holders 422-428 for holding the wireless antennas 462-468, the lower heat sink 450 having the raised pathways 750-762 formed therein, and the antenna cables 472-478 being routed between the lower heat sink 450 and the lower cover 420. However, the various embodiments are not limited thereto. According to one embodiment, the antenna cables 472-478 may be routed between the upper heat sink 440 and the upper cover 410 and the upper heat sink 440 may include raised pathways formed therein for providing tunnels for the cables 472-478 to be routed therethrough. According to one embodiment, the upper cover 410 may also include holders formed therein for holding the wireless antennas 462-468.

The disclosure is also not limited to heat sinks that are connected to, or located in close proximity to, upper and lower surfaces of a device. Rather, the disclosure could be included in heat sinks that provide heat transfer to various locations of a device including, but not limited to, front, back and/or sides.

Furthermore, while the disclosure has focused on an IP STB 300 it is not limited thereto. Rather, the use of heat sinks with raised pathways to enable antenna cables to be routed between the heat sink and an outer cover could be utilized with various types of wireless devices that include internal wireless antennas. For example, the use of this technology could be utilized in access points (e.g., routers, extenders, repeaters), lap top computers, tablets, and cell phones without departing from the current scope.

Moreover, the use of heat sinks with raised pathways to provide channels for antenna cables to located therewithin is not limited to between the heat sink and the outer housing of the device. Rather, the heat sink could be located between a circuit board and other internal parts of the device without departing from the current scope.

Additionally, the use of the raised pathways is not limited to antenna cables. For example, other cables that need to be routed that may be impacted by noise of a circuit board may be routed through the tunnels formed without departing from the current scope.

In simplest terms, the invention is the use of raised pathways on a heat sink to enable cables to be routed therewithin in order to limit circuit board noise from interfering with the cables while also providing sufficient heat transfer between the heat sink and the component the heat sink is flush against, or in close proximity to.

While the principles of the invention have been described above in connection with specific devices, apparatus, systems, algorithms, and/or methods, it is to be clearly understood that this description is made only by way of example and not as limitation. One of ordinary skill in the art will appreciate that various modifications and changes can be made without departing from the scope of the claims below.

The above description illustrates various embodiments along with examples of how aspects of particular embodiments may be implemented, and are presented to illustrate the flexibility and advantages of particular embodiments as defined by the following claims, and should not be deemed to be the only embodiments. One of ordinary skill in the art will appreciate that based on the above disclosure and the following claims, other arrangements, embodiments, implementations and equivalents may be employed without departing from the scope hereof as defined by the claims. Accordingly, the specification and figures are to be regarded in an illustrative rather than a restrictive sense, and all such modifications are intended to be included within the scope of the present invention. The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

The invention claimed is:

1. A heat sink apparatus comprising:
 a main surface configured to be housed within a housing, said housing including a first cover and a second cover; and
 one or more raised covered pathways defined by the main surface that include an antenna cable therethrough that releases radio-frequency interference (RFI), wherein the one or more raised covered pathways extend in a direction toward the first cover of the housing,
 wherein the heat sink apparatus defines at least one hole therethrough, and components on the second cover of the housing pass through the at least one hole defined in the heat sink apparatus, and
 wherein upon securing the heat sink apparatus to the second cover of the housing, the one or more raised covered pathways form one or more tunnels between the heat sink apparatus and the housing.

2. The heat sink apparatus of claim 1, wherein the heat sink apparatus provides noise isolation.

3. The heat sink apparatus of claim 1, wherein the main surface provides heat transfer between the heat sink apparatus and the housing.

4. The heat sink apparatus of claim 1, wherein the main surface is configured to be secured in a position substantially parallel to and adjacent to a surface of the second cover.

5. The heat sink apparatus of claim 1, wherein the heat sink apparatus is formed of aluminum.

6. The heat sink apparatus of claim 1, wherein the heat sink apparatus is formed of a metal.

7. A device comprising:
 a housing including a first cover and a second cover, said first cover and said second cover being configured to be secured together; and
 a heat sink having a main surface configured to be housed within the housing,
 wherein the heat sink defines at least one hole therethrough, and components on the second cover of the housing pass through the at least one hole defined in the heat sink,
 wherein the main surface of the heat sink defines one or more raised covered pathways that include an antenna cable therethrough that releases radio-frequency interference (RFI), wherein the one or more raised covered pathways extend in a direction toward the first cover of the housing, and
 wherein upon securing the heat sink to the second cover of the housing, the one or more raised covered pathways form one or more tunnels between the heat sink and the housing.

8. The device of claim 7, wherein the heat sink provides noise isolation.

9. The device of claim 7, wherein the heat sink provides heat transfer to the housing.

10. The device of claim 7, wherein the main surface is configured to be secured in a position substantially parallel to and adjacent to a surface of the second cover.

11. The device of claim 7, wherein the heat sink is formed of aluminum.

12. The device of claim 7, wherein the heat sink is formed of a metal.

13. A wireless electronic device comprising:
 a housing formed of a first cover and a second cover, wherein said first cover and said second cover and configured to be secured together;
 a printed circuit board with a plurality of components mounted thereto including at least one integrated circuit;
 an antenna cable that releases radio-frequency interference (RFI); and
 a heat sink having a main surface configured to be secured proximate to a surface of the second cover of the housing,
 wherein the heat sink defines at least one hole therethrough, and components on the second cover of the housing pass through the at least one hole defined in the heat sink,
 wherein the main surface of the heat sink defines one or more raised covered pathways therein that are dimensioned to house the antenna cable therethrough, and wherein the one or more raised covered pathways extend in a direction toward the first cover of the housing,
 wherein upon securing the heat sink to the second cover of the housing, the one or more raised covered pathways form one or more tunnels between the heat sink and the housing, and wherein the one or more tunnels route the antenna cable.

14. The wireless electronic device of claim 13, wherein the one or more tunnels provide noise isolation for the antenna cable.

15. The wireless electronic device of claim 13, wherein the heat sink extracts heat generated from the printed circuit board and transfers at least some of the extracted heat to the housing.

16. The wireless electronic device of claim 13, wherein the main surface is configured to be secured in a position substantially parallel to and adjacent to the surface of the second cover.

17. The wireless electronic device of claim 13, wherein the one or more raised covered pathways are configured so as to not interfere with the plurality of components on the printed circuit board or any other components within the housing.

18. The wireless electronic device of claim 13, wherein the heat sink is formed of a metal.

19. The wireless electronic device of claim 13, wherein the heat sink is formed of aluminum.

* * * * *